United States Patent
Maone

(10) Patent No.: US 7,911,237 B2
(45) Date of Patent: Mar. 22, 2011

(54) HIGH SPEED COMPARATOR

(75) Inventor: Francesco Alex Maone, Kreuzlingen (CH)

(73) Assignee: NXP B.V., Eindhoven (NL)

( * ) Notice: Subject to any disclaimer, the term of this patent is extended or adjusted under 35 U.S.C. 154(b) by 40 days.

(21) Appl. No.: 12/091,005

(22) PCT Filed: Oct. 16, 2006

(86) PCT No.: PCT/IB2006/053791
§ 371 (c)(1),
(2), (4) Date: Feb. 3, 2009

(87) PCT Pub. No.: WO2007/049179
PCT Pub. Date: May 3, 2007

(65) Prior Publication Data
US 2009/0212825 A1    Aug. 27, 2009

(30) Foreign Application Priority Data
Oct. 26, 2005    (EP) ..................................... 05109994

(51) Int. Cl.
*H03K 5/153*    (2006.01)
(52) U.S. Cl. ............... 327/77; 327/50; 327/63; 327/560; 330/252
(58) Field of Classification Search ............... 327/50–53, 327/63–67, 560, 563; 330/252, 253
See application file for complete search history.

(56) References Cited

U.S. PATENT DOCUMENTS

| | | | | |
|---|---|---|---|---|
| 5,065,045 A | * | 11/1991 | Mok | 327/63 |
| 5,600,269 A | * | 2/1997 | Song et al. | 327/52 |
| 6,008,667 A | | 12/1999 | Fahrenbruch | |
| 7,190,193 B1 | * | 3/2007 | Ross | 327/52 |
| 2005/0246125 A1 | * | 11/2005 | Marsh et al. | 702/117 |

FOREIGN PATENT DOCUMENTS

WO    2005069488 A1    7/2005

\* cited by examiner

*Primary Examiner* — Lincoln Donovan
*Assistant Examiner* — Shikha Goyal

(57) ABSTRACT

A comparator comprises a differential amplifier (T1, T2, T8, T9) having differential inputs (IN1, IN2) forming the comparator inputs, and a first and a second amplifier output (f1, f2) forming the comparator outputs of a first comparator stage, wherein the differential amplifier has first (T1, T8) and second (T2, T9) parallel branches. The comparator has a first current source circuit (32) defines a current to be driven through the differential amplifier, a second current source circuit (34) comprising a load driven by the first branch and a third current source circuit (36), comprising a load driven by the second branch. Circuitry (T6,T7) is provided for defining the voltage difference between the first and second amplifier outputs when the differential amplifier is in a stable state providing a differential output. This arrangement drives current through the two branches independently, so that the main transistors in each branch can be kept on to enable rapid response times. By fixing the voltage difference between the outputs, it is possible to remove dependency on the duty cycle on the common voltage mode of the differential amplifier.

7 Claims, 3 Drawing Sheets

HIGH SPEED COMPARATOR

The invention relates to a comparator for high frequency data signals, which comparator may be part of an integrated circuit.

Many applications require a high speed comparator which switches whenever a comparison succeeds. Often, the signals to be handled are differentials and the comparison consists in a conversion from double ended to single ended format. Double ended means in this context that the comparator deals with two signals in counter-phase, whereas single ended means that only one output signal including the result of the comparison is provided by the comparator.

Naturally, for processing/comparing fast signals, the comparator has to be sufficiently fast, i.e. usually faster than the signal sequence to follow the signal input variations. Moreover, when the operative frequency increases, constraints on setup and hold time become key points for the functionality of the whole system. Under such circumstances, it is a mandatory requirement at system-level to keep the internal clock duty-cycle as close as possible to 50% for an interface between the external and the internal signals of an integrated circuit (IC) domain.

The duty cycle describes the characteristics of an electrical signal and is particularly relevant to signals having a digital or rectangular waveform.

Digital or rectangular waveforms alternate between a low level and a high level or phase, with the transition between levels occurring substantially instantaneously. The term period refers to the duration of a single cycle. The duty cycle of a digital signal is generally defined as the ratio between the high phase and the period of the digital signal; it is usually stated as a percentage. For example, a digital signal having a pattern of 20% high phase has a 20/100 duty cycle. Generally it is desirable that the duty cycle of a digital clock signal be a pure 50% cycle, such a pure 50% duty cycle having a waveform with equal high and low portions.

To achieve the desired high performance, i.e. a high comparison rate or speed of a comparator, it is known to use operational amplifiers with two or more stages.

Figure 1:
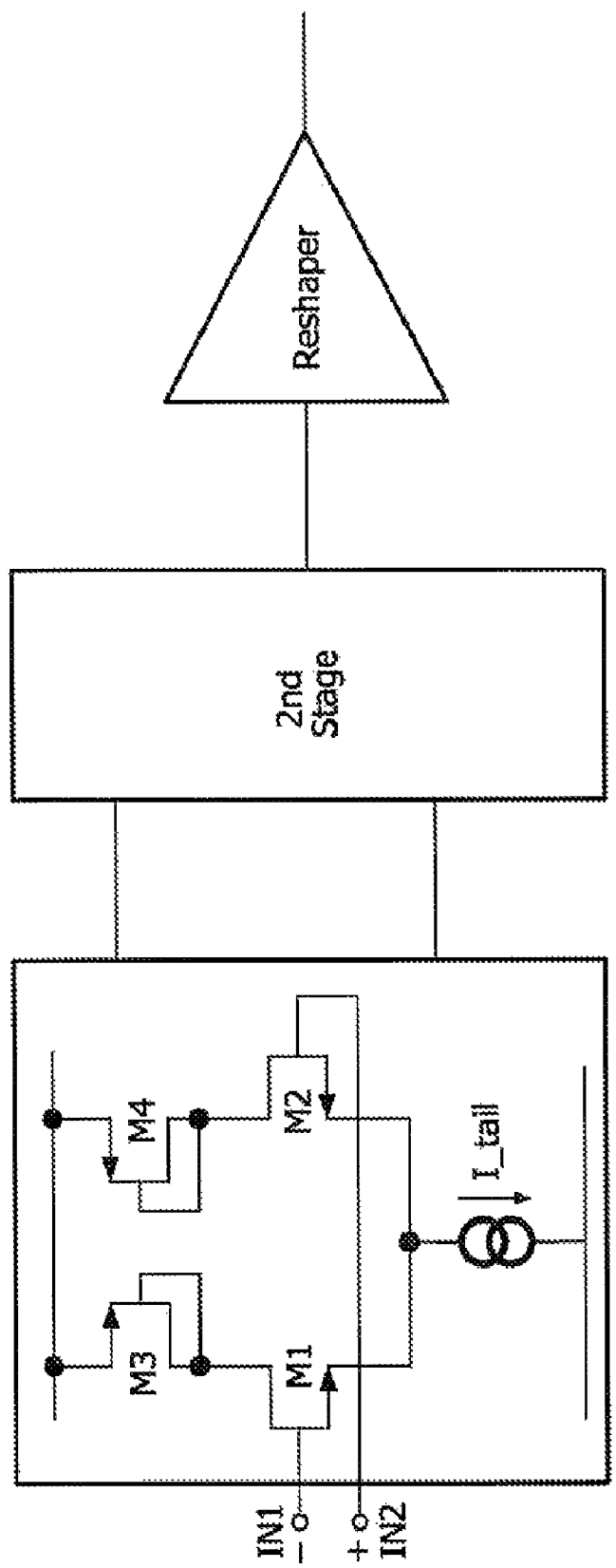

FIG. 1 shows a block diagram of a conventional architecture for a two stage comparator. The first stage is formed by a differential amplifier, illustrated in FIG. 1 on the left. Its two differential inputs IN1 and IN2 are conducted to the control inputs of a first and a second transistor M1 and M2, respectively. The first input terminal IN1 can be used as inverting input and the second input terminal IN2 can be used as non-inverting input of the differential amplifier. The outputs of the first and second transistor M1 and M2 are connected between a constant current source providing a constant tail current I_tail and two further transistors M3 and M4 working as load diodes. This first stage is followed by a second stage comprising an output amplifier.

In order to reduce the total current consumption, a class AB output stage may be chosen as second stage, especially because of its high current efficiency. The second stage may then be connected to a signal reshape unit.

This signal reshape unit is a circuit which makes the output of the class AB stage compliant to a digital signal, e.g. by means of an inverter stage. This is particularly useful in case of high-speed operative conditions. In such cases, it could happen that the class-AB stage provides a sinusoidal-shaped output waveform. The reshape unit performs then a squaring of the above mentioned output, making it compatible with any following digital circuit.

Unfortunately, to speed up the whole comparator, i.e. adapt it to high processing speed, a high tail current I_tail is required at the first stage. There are two reasons for this. The first reason is that a high gain is necessary. The second reason is that the sensitivity to small signal variations at the inputs IN1 and IN2 must be sufficiently large.

For high speed operation, the decision process inside the input stage should be implemented as fast as possible. The earlier the decision on the small signal variations at the inputs IN1 and IN2 is made, the faster is the system.

A further problem arises in the second stage. When this second stage has switched completely, at least one of its transistors is out of its active region, and more often even turns off. Then, this transistor needs some time to recover, introducing or necessitating a recovery time for the second stage. This recovery time will always be needed after a long static state. Obviously, this slows the whole comparator down.

According to the invention, there is provided a comparator, comprising:

a differential amplifier having differential inputs forming the comparator inputs, and a first and a second amplifier output forming the comparator outputs of a first comparator stage, wherein the differential amplifier has first and second parallel branches;

a first current source circuit, defining a current to be driven through the differential amplifier;

a second current source circuit, comprising a load driven by the first branch;

a third current source circuit, comprising a load driven by the second branch; and circuitry for defining the voltage difference between the first and second amplifier outputs when the differential amplifier is in a stable state providing a differential output.

This arrangement drives current through the two branches independently, so that the main transistors in each branch can be kept on to enable rapid response times. By fixing the voltage difference between the outputs (when the circuit is provided one of the two railed outputs), it is possible to remove dependency on the duty cycle on the common voltage mode of the differential amplifier.

This enables a high speed comparator with low power consumption, and which can easily be adapted for implementation into an integrated circuit.

The term "in a stable state providing a differential output" is intended to mean that there is a differential voltage at the inputs, so that the differential amplifier has toggled to one of the two stable output states.

The first branch may comprise a first drive transistor in series with a first switching transistor, the second output being defined at the junction between the first drive transistor and the first switching transistor. The second branch then comprises a second drive transistor in series with a second switching transistor, the first output being defined at the junction between the second drive transistor and the second switching transistor. This defines a symmetrical differential amplifier configuration.

The first switching transistor can be controlled by the first output and the second switching transistor can be controlled by the second output. These operate to increase the toggling of the differential amplifier.

The first current source circuit can drives a first current, and the second and third current source circuits can each drive a second current which is half the first current. This means that any change in current flow in one of the branches in response to a change to the inputs to the differential amplifier must be compensated by an equal and opposite change in current in the other branch. This sets up a bistable device which toggles to one of the two outputs in response to a current change in one of the branches.

The circuitry for defining the voltage difference may comprise a first holding transistor between the second output and the first current source circuit, and a second holding transistor between the first output and the second current source circuit. By controlling the first holding transistor using the first output, and controlling the second holding transistor using the second output, it is possible to use the holding transistors to define a fixed voltage between the outputs, in particular the threshold voltage of the holding transistor which is turned on.

The second and third current source circuits can each have two current outputs, one for driving a current through the associated holding transistor and one for driving a current from the output defined in the associated branch.

The comparator preferably further comprises a second comparator stage whose inputs are connected to the comparator outputs of the first comparator stage and whose output forms the comparator output. This provides the digital voltage levels to the output of the comparator.

The invention also provides a method of deriving a comparator output, comprising:

driving a current along each branch of a differential amplifier, each branch providing one of the differential outputs of the differential amplifier; and when the output of the differential amplifier switches to a stable state providing a differential output, setting the voltage difference between the differential amplifier outputs to a constant voltage.

The setting may comprise switching on a transistor which has its gate connected to one of the outputs of the differential amplifier, and its source connected to the other output of the differential amplifier.

Figure 2:
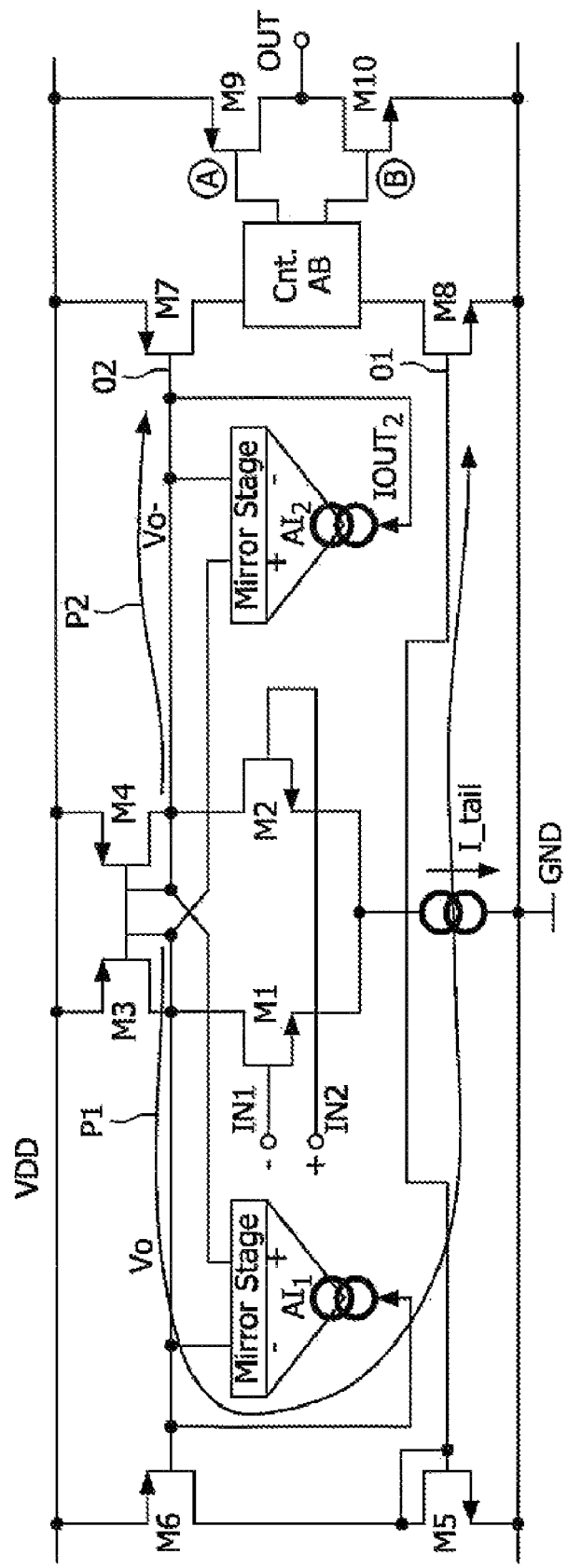

An example of the invention will now be described in detail with reference to the accompanying drawings, in which FIG. 1 is a schematic diagram of an embodiment of a comparator according to the prior art; and FIG. 2 is a schematic diagram of a second embodiment of a comparator according to the prior art; and FIG. 3 a schematic diagram of an example of a comparator according to the invention.

WO 2005/069488 discloses one way to improve the switching speed whilst maintaining a 50% duty cycle, and this document is incorporated herein by way of reference material.

FIG. 2 shows a first comparator circuit disclosed in WO 2005/069488, and this circuit is used to explain the problems addressed by the present invention.

The comparator circuit shown is in principle a two stage comparator. The first comparator stage includes a differential amplifier M1 and M2 and two differential current amplifiers $AI_1$ and $AI_2$. The second comparator stage is an output amplifier and includes the transistors M7 to M10.

The differential amplifier of the first comparator stage has two input transistors MI and M2 whose control inputs are coupled to the inputs IN1 and IN2 of the comparator. The first input terminal IN1 can be used as inverting input and the second input terminal IN2 as non-inverting input of the differential amplifier. The outputs of the first and second transistor M1 and M2 are connected between a constant current source providing a constant tail current I_tail and two further transistors M3 and M4 working as load diodes.

The improvement provided by the arrangement of FIG. 2 relates to the use in the first comparator stage of the first and second differential current amplifiers $AI_1$ and $AI_2$. The two inputs of the first differential current amplifier $AI_1$ are coupled to the outputs Vo and Vo−, respectively, of the differential amplifier. The same applies to the inputs of the second differential current amplifier $AI_2$.

The output of the first differential current amplifier $AI_1$ is connected to the first output Vo of the differential amplifier, whereas the output of the second differential current amplifier $AI_2$ is connected to the second output Vo− of the differential amplifier. The common output of the differential amplifier and the first differential current amplifier $AI_1$ are connected to the control input of the transistor M6.

One of the control outputs of this transistor M6 is connected to the supply voltage VDD, while the other control output of this transistor M6 is connected to the control output of the transistor M5, the latter functioning as diode, and to the control input of the transistor M8.

The output of the transistor M6 is usable as first output O1 of the first comparator stage. The common output of the differential amplifier and the second differential current amplifier $AI_2$ forms the second output O2 of the first comparator stage.

The control inputs of the transistors M7 and M8 of the second comparator stage are connected to the outputs O1 and O2 of the first comparator stage.

The transistors M7 and M8 are used to connect the supply voltage VDD or ground GND (respectively) to the output amplifier. At the output OUT of the output amplifier, the comparator signal, which is the result of the comparison between the signal voltages at inputs IN1 and IN2, is obtained.

The comparator illustrated in FIG. 2 works as follows.

The current is boosted trough the second comparator stage only when necessary. A residual current is used to prevent that the transistors in the second comparator stage are completely switched off. By means of a positive current feedback path, the transistors M3 and M4, which work as load, are then forced by an additional current to be "soft on". This is explained further below. The result is that the controlling voltages for the second comparator stage are speeded up. The residual current keeps on flowing even after the transition is completed, as explained in the following.

The differential current amplifiers $AI_1$ and $AI_2$ are sourced by the currents flowing through the transistors M3 and M4 and are mirrored by the transistors of the same size inside the differential current amplifiers $AI_1$ and $AI_2$. The output current of the current amplifiers $AI_1$ and $AI_2$ is zero when the current to the negative input terminal is greater than the current to the positive input terminal, and is proportional (with a factor α) to the difference in current when the current to the negative input terminal is equal to or lower than the current to the positive input terminal.

Suppose that a positive voltage step occurs at the negative input IN1 while on the positive input IN2 it does not.

The current flowing through the load transistor M3 increases; the second current amplifier $AI_2$ senses this difference and provides an output current $IOUT_2$ proportional to the difference between the currents IM3 and IM4, wherein IM3 is the current flowing through the transistor M3 and IM4 is the current flowing through the transistor M4.

An extra negative current is drawn from the transistor M4 (to feed the output of the current amplifier $AI_2$) and this results in a small increase in the absolute value of the drain-source voltage Vds4 of the transistor M4, while the drain-source voltage Vds2 of transistor M2 decreases. This forces transistor M1 to draw a small current from transistor M2. This small current contributes to the total residual current in transistor M3 increasing it, thus accelerating this positive feedback.

When the transaction is completed, the residual negative current still flows through transistor M4 and thus towards the output O2. This so-called "soft on" helps the next switching phase, because the transistor M4 is not completely switched off.

As can be seen from the above, this approach provides a positive feedback mechanism which prevents the transistors on each side of the differential amplifier from turning fully off. In the prior art embodiment of FIG. 1, the transistor M4 would have been completely switched off, i.e. the current IM4 through transistor M4 would be zero. After a long static state, it would take some time to switch on the transistor M4 in the prior art embodiment of FIG. 1.

In case of a positive voltage step at the positive input IN2, the behaviour of the comparator circuit is in principle the same as described above. But now, instead of the transistor M4, the transistor M3 is switched "soft on".

To reduce the total current consumption, a class-AB operational amplifier is again chosen because of its high current efficiency at the output stage. The output stage uses current only when a transition takes place, in all other cases only a quiescent current is flowing through the output stage.

Overall, the comparator as shown in FIG. 2 operates at higher speed and has a lower current consumption than the embodiment shown in FIG. 1.

One possible problem with the arrangement of FIG. 2 has been recognised in WO 05/064988, and this is an intrinsic asymmetry in the output waveform, due to the different path length from the input to the output stage, indicated by the two arrows P1 and P2 in FIG. 2.

The particular path which includes more transistors than the other path, is defined as the longer path. Obviously this is the path P1 in the embodiment shown in FIG. 2. The asymmetry may result in an unbalanced duty cycle having a duty cycle variation $\delta_{CLK}$.

In certain cases, this variation $\delta_{CLK}$ may become a problem with respect to the functionality of the whole system. For instance, in applications like mLVDS/RSDS interfacing, i.e. when interfacing "mini low voltage differential signals" (mLVDS) and "reduced swinging differential signals" (RSDS), since both protocols work on the rising and falling edges of the clock and the setup/hold specifications are intended for both transitions, a large duty cycle variation may complicate the ability of the circuit to meet the required specifications.

WO 05/069488 discloses a solution to this problem, and reference is made to the document for further details. Essentially, the solution presented in WO 05/069488 is to increase the speed of data transfer in the slower path.

This invention also relates to a comparator architecture in which imbalance in the drive of the output stage is compensated. In addition, the example of the invention described below provides an architecture in which the duty cycle is independent of the common mode voltage.

Figure 3:
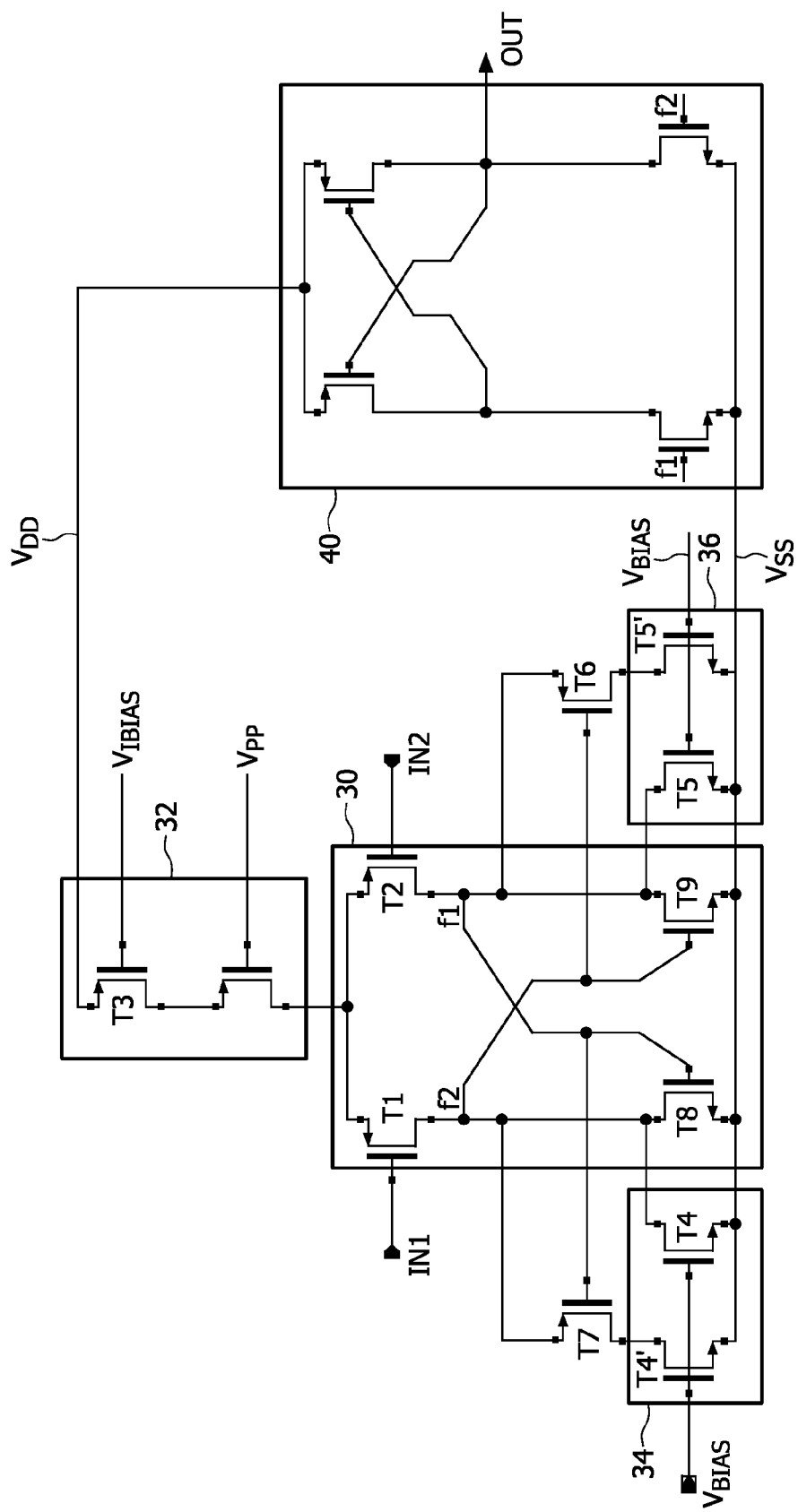

FIG. 3 shows an example of circuit of the invention.

The core of the circuit again comprises a differential amplifier 30, in which a first transistor T1 receives one of the differential inputs as control input and a second transistor T2 receives the other differential input as control input.

The amplifier 30 is connected in series with a current source 32 between power lines $V_{DD}$ and $V_{SS}$.

The load driven by the transistor T1 is the transistor T4, and the load driven by the transistor T2 is the transistor T5. The transistors T8 and T9 are switched in complementary manner to the transistors T1 and T2. For example, when transistor T1 is turned on, the output f2 is pulled high which in turn switches on the transistor T9. This pulls the output f1 low which turns off the transistor T8. This provides the desired bistable comparator functionality, and this analysis shows that the output currents of the transistors T1 and T2 are indeed driven through the transistors T4 and T5.

This arrangement provides the load of the differential amplifier as an output transistor of a current source circuit, instead of the conventional diode-connected transistor (for example M3 and M4 in FIG. 2).

The transistor T4 comprises the output transistor of a current source circuit 34 of transistors T4' and T4, and the transistor T5 comprises the output transistor of a current source circuit 36 of transistors T5' and T5. The input transistors T4' and T5' of these current source circuits 34,36 are provided with a gate bias voltage $V_{BIAS}$ to provide the desired current flow. The current source circuits 34,36 are designed to allow a maximum current flow through each transistor T4, T4', T5, T5' corresponding to half the current source current of the current source 32.

If the inputs IN1 and IN2 are equal, the current of the current source 32 will be divided equally between the two branches, and the two internal outputs f1 and f2 will be equal (due to the symmetry of the circuit), and the output OUT will fall in the middle of its range.

Any unbalancing of the circuit will cause very rapid current steering, toggling the outputs f1 and f2 in opposite directions. This commutation speed is increased by the transistors T8 and T9. These may be considered to be switching transistors. Any current imbalance is manifested as an increase in current through one of the transistors T8,T9 and a decrease in current through the other. When this process starts, the change in operating point of the transistors T8,T9 accelerates the process.

Ignoring the transistors T6 and T7, which are discussed further below, the output swing of the circuit (the voltage range of f1 and f2) is in the range from $V_{SS}+V_{DS(T8,T9)}$, to $V_{in}+V_{t(T1,T2)}-V_{DS(T1,T2)}$.

The value $V_{SS}+V_{DS(T8,T9)}$ defines the voltage at the drain of T8 or T9 when it is turned on, as this is the lowest voltage for the output f1 or f2. The voltage $V_{in}+V_{t(T1,T2)}-V_{DS(T1,T2)}$ defines the voltage at the drain of T1 or T2 when it is turned on, as this is the highest voltage for the output f1 or f2.

The voltage swing between these values is dependent on the common mode voltage, in particular the input voltage to be applied to the comparator.

The next stage 40, which is simply a level shifting arrangement, translates the input signals into full swing digital signals. Because of the dependency of the voltage swing on the common mode voltage, the point at which the circuit 40 toggles is also dependent on the common mode voltage, and will therefore take place at different voltage levels depending on the voltage at which the inputs (f1 and f2) cross over.

In particular, if the signals f1 and f2 change at the same rate between the high and low values, then the time to reach the cross over point will be a function of the height of the voltage swing between the voltage rails of f1 and f2. As a result, the duty cycle can vary with the common mode voltage.

The transistors T6 and T7 are provided to address this issue. These transistors operate as dynamic clamping devices on the output signals. During commutation of the outputs f1,f2, each transistor is driven on its gate by the opposite output. For example, when the gate of the transistor T7 is brought low (in response to a low output f1 and a high output f2), the source voltage at the output f2 will follow, but with a higher voltage by the amount of the threshold voltage of the transistor T7. The low voltage f1 of course turns on the transistor T7, which is a p-type transistor as shown.

The transistor T7 thus defines the voltage at the output f2, which in turn determines the operating point of the transistor T4. However, the voltage swing is no longer dependent on the input voltage, and the transistors T7 and T8 function as limiters which fix the voltage difference between the outputs f1 and f2.

The same operation holds for the transistor T6, with the result that the voltage swing is fixed by the threshold voltage and is not dependent on the common mode voltage. The transistors thus make the voltage swing on the f1 and f2 outputs independent of the input voltage. The transistors T6 and T7 are operated in complementary manner, and may be considered to be holding transistors, as they hold the voltage difference between the outputs f1,f2 at their threshold voltage.

The stable condition of the circuit will now be explained.

Using the example above of f1 low and f2 high, the p-type transistor T7 is turned on, and current in the left branch sinks through the two transistors T4 and T4'. The transistor T8 has a low gate voltage and is therefore turned off. The high output f2 (which is the threshold voltage of the transistor T7 above the output f1) turns on the transistor T9, which also pulls down the voltage at f1.

The transistor T2 is not turned fully off, and some current from the right branch also sinks through the current source circuit 36. The p-type transistor T6 is off because of the high gate voltage f2, and current therefore sinks through the transistors T5 and T9.

The currents through the two transistors of each current source circuit 34,36 and the transistors T8,T9 will together match the current of the current source 32. The proportion which passes through each transistor will depend on the transistor dimensions and the operating conditions. One of the transistors T6 and T7 will be on and the other off, so that only one of T4' and T5' will sink any current. In the example above, the transistor T7 is turned on during the switching of f1 from high to low and f2 from low to high, and transistor T7 drains current from the transistor T1 to the transistor T4', whereas the transistor T6 is turned off, and no current is drained by the current source transistor T5'.

As for the circuit of FIG. 2, the circuit of FIG. 3 prevents the transistors being turned fully off in the branches of the differential amplifier, by means of the current source circuits 34,36. This provides improved reaction time of the circuit, and therefore enables high speed operation.

This circuit enables very low jitter in the output signal, and for high operating frequencies. For example, the circuit can run at 500 Mbps, and provide jitter of less than 150 ps. The duty cycle is also constant over the allowed range of common mode voltages.

A comparator has been made based on the design explained above, and in addition to operating at the data outlined above, and with the maximum jitter, the circuit can also achieve very low power consumption of 3.5 mW, with a duty cycle stable between 49% and 53%.

This represents a significant power saving, but the circuit additionally enables a saving in silicon area required.

Only one example of the invention has been described in detail. The circuit can of course be modified in many ways, for example the specific arrangement of n-type and p-type transistors is not the only way to implement the same function. More fundamental changes are also possible, as the invention relates generally to a comparator arrangement in which a current is driven through differential amplifier branches, and the voltage difference between the amplifier outputs is fixed to a level independent of the input voltages when the differential amplifier is in a stable state providing a differential output.

In the description and claims, reference has been made to current source driving a current through transistors. This should be understood to include the sinking of current as well as the provision of current.

Various other modifications will be apparent to those skilled in the art.

The invention claimed is:

1. A comparator, comprising:
   a differential amplifier having differential inputs forming comparator inputs, and a first and a second amplifier output forming comparator outputs of a first comparator stage, wherein the differential amplifier has first and second parallel branches;
   a first current source circuit, defining a current to be driven through the differential amplifier;
   a second current source circuit, comprising a load driven by the first branch;
   a third current source circuit, comprising a load driven by the second branch; and
   circuitry for defining the voltage difference between the first and second amplifier outputs when the differential amplifier is in a stable state providing a differential output comprising a first holding transistor between the second amplifier output and the second current source, and a second holding transistor between the first amplifier output and the third current source, wherein the holding transistors hold the voltage difference between the amplifier outputs at their threshold voltage and the first branch comprising a first drive transistor in series with a first switching transistor, the second amplifier output being defined at the junction between the first drive transistor and the first switching transistor, the second branch comprising a second drive transistor in series with a second switching transistor, the first amplifier output being defined at the junction between the second drive transistor and the second switching transistor.

2. A comparator as claimed in claim 1, wherein the first switching transistor is controlled by the first amplifier output and the second switching transistor is controlled by the second amplifier output.

3. A comparator as claimed in claim 1, wherein the first current source circuit drives a first current, and the second and third current source circuits each drive a second current which is half the first current.

4. A comparator as claimed in claim 1, wherein the first holding transistor is controlled by the first amplifier output, and the second holding transistor is controlled by the second amplifier output.

5. A comparator as claimed in claim 2, wherein the second and third current source circuits each have two current outputs, one for driving a current through the associated holding transistor and one for driving a current from the output defined in the associated branch.

6. A comparator as claimed in claim 1, further comprising a second comparator stage whose inputs are connected to the comparator outputs of the first comparator stage and whose output forms the comparator output.

7. A comparator as claimed in claim 1, wherein the circuitry for defining the voltage difference defines a voltage difference which is independent of the input voltages to the differential inputs.

* * * * *